United States Patent
Lee et al.

(10) Patent No.: US 7,285,966 B2
(45) Date of Patent: Oct. 23, 2007

(54) PROBE AND METHOD OF MAKING SAME

(75) Inventors: Oug-Ki Lee, Seoul (KR); Jung-Hoon Lee, Kunpo-shi (KR)

(73) Assignee: Phicom Corporation, Seoul (KR)

( * ) Notice: Subject to any disclaimer, the term of this patent is extended or adjusted under 35 U.S.C. 154(b) by 0 days.

(21) Appl. No.: 10/549,335

(22) PCT Filed: Mar. 16, 2004

(86) PCT No.: PCT/KR2004/000559

§ 371 (c)(1), (2), (4) Date: Sep. 13, 2005

(87) PCT Pub. No.: WO2004/084295

PCT Pub. Date: Sep. 30, 2004

(65) Prior Publication Data

US 2006/0171425 A1    Aug. 3, 2006

(30) Foreign Application Priority Data

Mar. 17, 2003    (KR) ...................... 10-2003-0016634

(51) Int. Cl.
*G01R 31/02* (2006.01)
(52) U.S. Cl. ...................... 324/754; 324/761
(58) Field of Classification Search ........ 324/754–758, 324/761–762; 439/482
See application file for complete search history.

(56) References Cited

U.S. PATENT DOCUMENTS 4,967,148 A * 10/1990 Doemens et al. ........... 324/754
5,545,045 A * 8/1996 Wakamatsu .................. 439/70
6,150,830 A * 11/2000 Schmid et al. ............. 324/761
6,242,929 B1 * 6/2001 Mizuta ....................... 324/754

(Continued)

FOREIGN PATENT DOCUMENTS

JP    2001-091537    6/2001

(Continued)

OTHER PUBLICATIONS

PCT/KR2004/000559 International Search Report dated Jul. 6, 2004.

*Primary Examiner*—Vinh Nguyen
*Assistant Examiner*—Arleen M. Vazquez
(74) *Attorney, Agent, or Firm*—Daly, Crowley, Mofford & Durkee, LLP

(57) ABSTRACT

Disclosed herein are a probe and a method of making the same, and more particularly to a probe having a minute pitch, with which a probe card corresponding to arrangement of pads formed with a massed shape or other various shapes on a wafer is made, and a method of making the same. The probe having a prescribed thickness and formed in the shape of a flat plate. The probe comprises a body part bent at the middle thereof so that the body part is elastically tensioned or compressed when a tension force or a compression force is applied to the body part at the upper and lower ends thereof, a connection part integrally formed with the lower end of the body part, the connection part being fixed to a substrate, and a tip part integrally formed with the upper end of the body part, the tip part contacting a pad of an element.

6 Claims, 15 Drawing Sheets

U.S. PATENT DOCUMENTS

| | | | |
|---|---|---|---|
| 6,411,112 B1 * | 6/2002 | Das et al. | 324/754 |
| 6,847,221 B2 * | 1/2005 | Kimoto et al. | 324/762 |
| 6,967,493 B2 * | 11/2005 | Mori et al. | 324/754 |
| 7,084,650 B2 * | 8/2006 | Cooper et al. | 324/754 |
| 2001/0026166 A1 | 10/2001 | Khoury et al. | |

FOREIGN PATENT DOCUMENTS

| | | |
|---|---|---|
| KR | 1019980027441 | 9/2000 |
| WO | WO 2004/084295 A1 | 9/2003 |

* cited by examiner

PROBE AND METHOD OF MAKING SAME

CROSS-REFERENCE TO RELATED APPLICATIONS

This application is a National Stage application under 35 U.S.C. § 371 of and claims the benefit of International Application No. PCT/KR2004/000559 filed on Mar. 16, 2004, which claims priority to Korean Application No. 10-2003-0016634, filed on Mar. 17, 2003, which is hereby incorporated by reference.

TECHNICAL FIELD

The present invention relates to a probe and a method of making the same, and more particularly to a probe having a minute pitch, with which a probe card corresponding to arrangement of pads formed with a dense shape or other various shapes on a wafer is made, and a method of making the same.

BACKGROUND ART

Generally, semiconductor integrated circuit devices are tested when manufacturing the devices, after manufacturing the devices, or when packaging the devices, in order to verify whether the devices are manufactured while the whole or partial electric characteristics of the devices exactly correspond to the original design of the devices.

The equipment for performing the above-mentioned test is probe equipment with a test apparatus and a probe card. The probe card serves to electrically connect a various electrical signals-generating part in the test apparatus and a pad in the semiconductor integrated circuit device, or an electric signal detecting part in the test apparatus and the pad in the semiconductor integrated circuit device.

One of the conventional probe cards is a needle-type probe card, which is shown in FIG. 1. The needle-type probe card includes needle-type probes 12 each having a bent end. The body of each needle-type probe 12 is disposed on a prescribed position of a fixing member 13, and is then fixedly attached to the fixing member 13 by means of epoxy. The fixing member 13 is attached to a main circuit board 11. The other end of the needle-type probe 12 is connected to a prescribed circuit of the main circuit board 11 by means of soldering. In this way, the probe card is prepared. Elasticity is required in order to stably connect the needle to a pad of the semiconductor integrated circuit device. However, the level and position of the needle-type probe is distorted when it is repeatedly used. Consequently, the conventional needle-type probe card has a drawback in that maintenance and repair of the probe are required when the needle-type probe card is used.

Another conventional probe card is a vertical-type probe card, which is shown in FIG. 2. At the upper surface of a main circuit board 21 is disposed a fixing plate 23, and at the lower surface of the main circuit board 21 are disposed a plurality of guide plates 24. Through the main circuit board 21, the fixing plate 23, and the guide plates 24 are formed a plurality of through-holes, which are regularly arranged at the corresponding positions of the main circuit board 21, the fixing plate 23, and the guide plates 24. Through through-holes are inserted needle-type probes 22, respectively. The ends of the needle-type probes drawn out from the fixing plate 23 are connected to prescribed circuits of the main circuit board 21, respectively, by means of soldering. In this way, the probe card is prepared. However, the vertical-type probe card also has a drawback in that the level of the probe is distorted when it is repeatedly used, and thus the elasticity thereof is lost, as with the above-mentioned needle-type probe. Furthermore, the vertical-type probe card has another drawback in that electrical interaction is caused between adjacent needles when the probe card is used to test a high-speed operating type semiconductor integrated circuit since the needles are long and arranged adjacent to each other, and thus accuracy of the test is lowered.

Any one of the needle-type probe card and the vertical-type probe card has a relatively large size. On the other hand, an element, which is to be tested, becomes increasingly miniaturized and precise according to the advancement of the technology. Consequently, any one of the needle-type probe card and the vertical-type probe card has a drawback in that a miniaturized and precise element is not appropriately tested. In other words, no relatively large probe card can test all elements on a wafer, as the arrangement of a plurality of pads on the elements formed on the wafer is compact and dense. As a result, it is required that several tests be performed on one wafer.

In order to overcome the above-mentioned problems, there have been invented compact and miniaturized probe cards. Representative examples of such compact and miniaturized probe cards are a micro spring-type probe card and a cantilever-type probe card.

The micro spring-type probe card is shown in FIG. 3a, and the micro spring-type probe card is manufactured as follows: A bump 33 is formed on a substrate 32 as shown in FIG. 3b. To the bump 33 is connected a probe-shaped wire 34a by means of a wire bonder. The wire 34a is plated at the surface thereof so that the wire 34a is thick and strong. An additional silicon wafer 35 is etched, and then plated, to form a supporting beam 34b and a probe tip 34c. The supporting beam 34b is bonded to the wire 34a so that a spring-type probe 34 with the probe tip 34 is formed. After the spring-type probe 34 is formed as mentioned above, the silicon wafer 35 is removed. The substrate 32 with the above-mentioned construction is attached to a main circuit board 31 by means of an additional reinforcing member 36 as shown in FIG. 3a.

The cantilever-type probe card is shown in FIG. 4a, and the cantilever-type probe card is manufactured as follows: A bump 43 is formed on a substrate 42 as shown in FIG. 4b. On an additional silicon wafer 44 are formed a probe tip 45b and a supporting beam 45a. Subsequently, one end of the bump 43 is bonded to one end of the supporting beam 45a to form a probe 45 with the probe tip 45b. After the probe is formed as mentioned above, the silicon wafer 44 is removed. The substrate 42 with the above-mentioned construction is attached to a main circuit board 41 by means of an additional reinforcing member 46 as shown in FIG. 4a.

By means of the micro spring-type probe card and the cantilever-type probe card, a test on a wafer having integrated elements formed thereon is smoothly performed.

However, the probe beam and the probe tip are arranged level with each other (34b and 34c in FIG. 3b, 45a and 45b in FIG. 4b). When pads on an element, which is to be tested, are aggregated more closely, and when the arrangement of the pads on the element is complicated, a problem is caused. In the case that the cantilever-type probe card shown in FIG. 4a is used to test a wafer having the arrangement of elements 51 as shown in FIG. 5a, for example, it is required that the cantilever-type probe card be constructed as shown in FIG. 5b. Specifically, it is required that all probes 61a be disposed on a unit substrate 61 (FIG. 5b) of a probe card 60 (FIG. 5b) having a size corresponding to that of the element in order to test all pads 51a (FIG. 5a) on each element. When the probes are arranged along the sides, however, it may be not possible to arrange the probes at corners. In this case, therefore, some of the probes are arranged over adjacent unit substrates 61. Consequently, it is required that tests on the wafer be performed two or more times.

In the case that the pads on a wafer, which is to be tested, are arranged in straight lines, the cantilever-type probe has an arrangement as shown in FIGS. 6a and 6b. The pitch p indicated in the FIG. 6a corresponds to the distance between two adjacent pads on the wafer. It is easily understood that the pitch p is larger than the width w of each probe 65. When the distance between the pads on the wafer is smaller than the width w of the probe 65, therefore, the test cannot be rapidly performed.

In the conventional probe cards as describe above, increase of the number of the probes is restricted. Consequently, it is impossible to test a plurality of semiconductor devices at once, which does not satisfy the desires of the semiconductor device manufacturers who are trying to increase efficiency of the test.

DISCLOSURE OF THE INVENTION

Therefore, the present invention has been made in view of the above problems, and it is an object of the present invention to provide a probe having a minute pitch, with which a probe card corresponding to arrangement of pads formed with a dense shape or other various shapes on a wafer is made, and a method of making the same.

In accordance with one aspect of the present invention, the above and other objects can be accomplished by the provision of a probe having a prescribed thickness and formed in the shape of a flat plate, the probe comprising: a body part bent at the middle thereof so that the body part is elastically tensioned or compressed when a tension force or a compression force is applied to the body part at the upper and lower ends thereof, a connection part integrally formed with the lower end of the body part, the connection part being fixed to a substrate; and a tip part integrally formed with the upper end of the body part, the tip part contacting a pad of an element.

In accordance with another aspect of the present invention, there is provided a probe card including probes, each of the probes having a prescribed thickness and formed in the shape of a flat plate, wherein the probe comprises: a body part bent at the middle thereof so that the body part is elastically tensioned or compressed when a tension force or a compression force is applied to the body part at the upper and lower ends thereof; a connection part integrally formed with the lower end of the body part, the connection part being fixed to a substrate; and a tip part integrally formed with the upper end of the body part, the tip part contacting a pad of an element, wherein the body part comprises: a horizontal section; and a first vertical section bent vertically upward from one end of the horizontal section, the first vertical section being integrally connected to the tip part; a second vertical section bent vertically downward from the other end of the horizontal section, the second vertical section being integrally connected to the connection part, wherein the lengths of the horizontal section, the first vertical section, and the second vertical section of the body part are changed to form more than two kinds of probes, and wherein the more than two kinds of probes are fixedly attached on the substrate of the probe card.

In accordance with yet another aspect of the present invention, there is provided a method of making a probe, comprising: a step 1 for applying a sacrifice layer on the whole upper surface of a silicon wafer, coating the sacrifice layer at the upper surface thereof with a photoresist, and attaching a first mask having a shape pattern of a probe to the upper surface of the photoresist; a step 2 for exposing and developing the photoresist by means of the first mask, and removing the first mask; a step 3 for performing electrolytic plating on the upper surface of the sacrifice layer having the pattern fixed by means of the exposure and development to form a first metallic film; and a step 4 for removing the photoresist and etching the sacrifice layer to separate the first metallic film from the silicon wafer.

BRIEF DESCRIPTION OF THE DRAWINGS

The above and other objects, features and other advantages of the present invention will be more clearly understood from the following detailed description taken in conjunction with the accompanying drawings, in which:

FIG. 5b is a plan view illustrating the manufacture of a conventional probe card for checking the element shown in FIG. 5a;

FIG. 12c is a front view of a probe shown in FIG. 12a;

BEST MODE FOR CARRYING OUT THE INVENTION

Figure 7A:
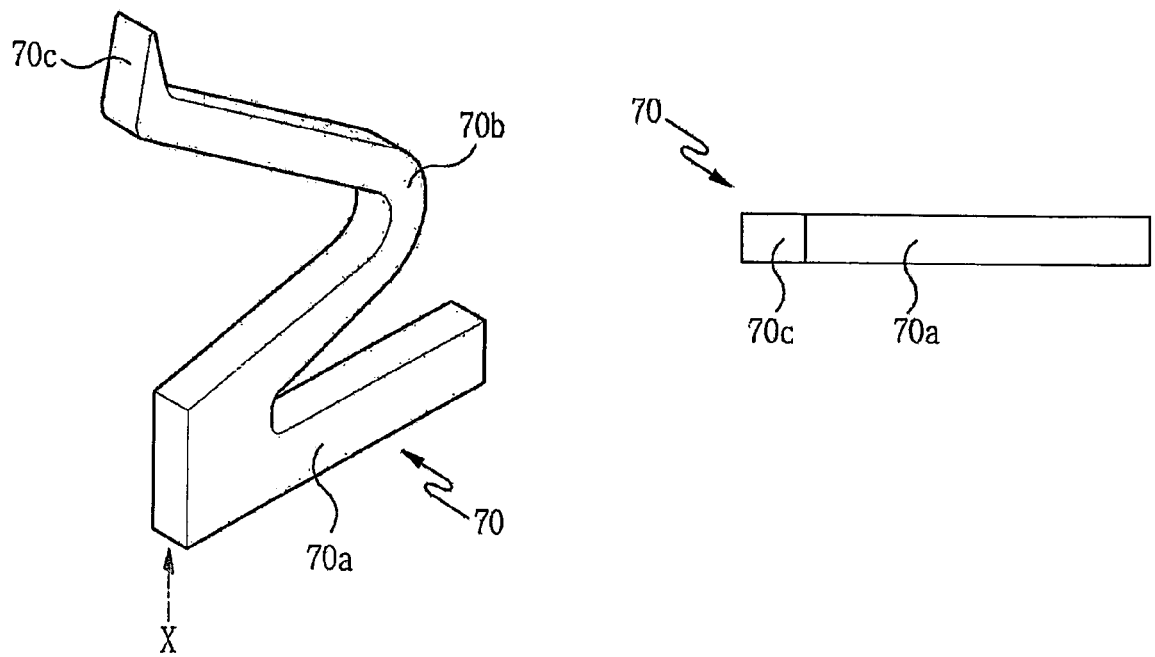
FIG. 7a is a perspective view and a bottom view respectively showing a preferred embodiment of the present invention.

Probes according to preferred embodiments of the present invention are shown in FIGS. 7a to 7d. Referring to the left side of FIG. 7a, a probe 70 is formed in the shape of a bent plate, and is made of metal. The probe 70 has a body part 70b, which is bent at the middle thereof so that the body part 70b is elastically compressed and expanded when an external force is applied to the body part 70b. When a tension force or a compression force is applied to the body part 70b at the upper and lower ends thereof, the body part 70b is elastically tensioned or compressed within a prescribed allowable limit. The probe 70 also has a connection part 70a, which is integrally formed with the lower end of the body part 70b. The connection part 70a serves as a supporting beam for supporting the body part 70b when one end of the body part 70b is connected to a substrate. The probe 70 further has a tip part 70c integrally formed with the upper end of the body part 70b. The tip part 70c directly contacts a pad of an element to be tested. The bottom of the probe 70, which is seen in the direction X at the left side of FIG. 7a, is shown at the right side of FIG. 7a. It can be seen from FIG. 7a that the tip part 70c is more extended to the left side than the connection part 70a. This means that the tip part 70c is disposed at the outermost side of the probe 70 in the horizontal direction at the left side of FIG. 7a. The reason why the probe 70 is constructed as described above is that adjacent tip parts can be arranged densely in straight lines by an intersection arrangement of the probes, which will be described later.

Figure 6A:
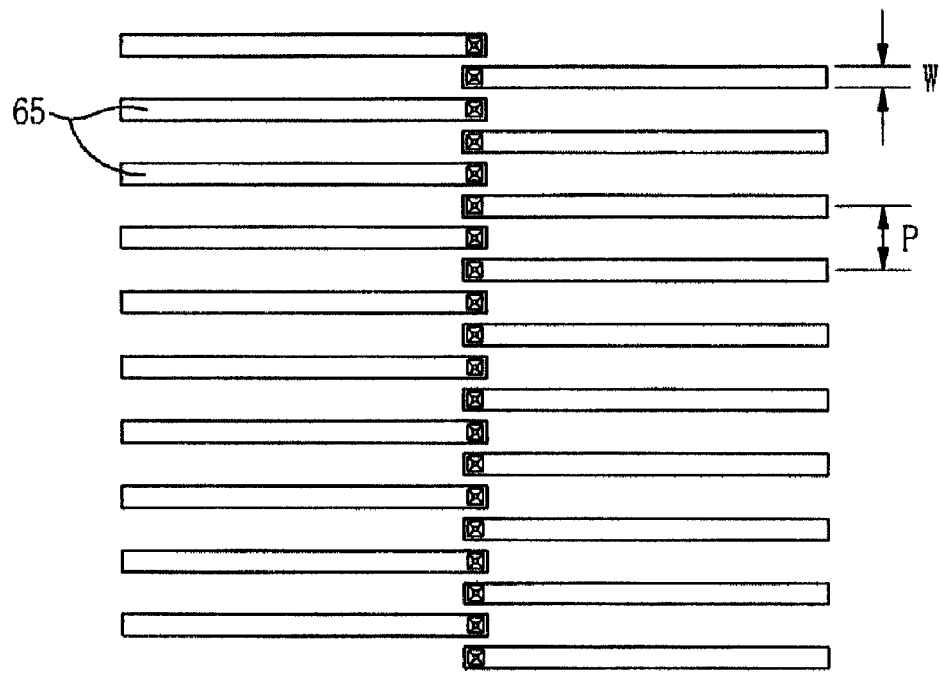
FIGS. 6a and 6b are a plan view and a perspective view showing the disposition of conventional probes, respectively.
Figure 6B:
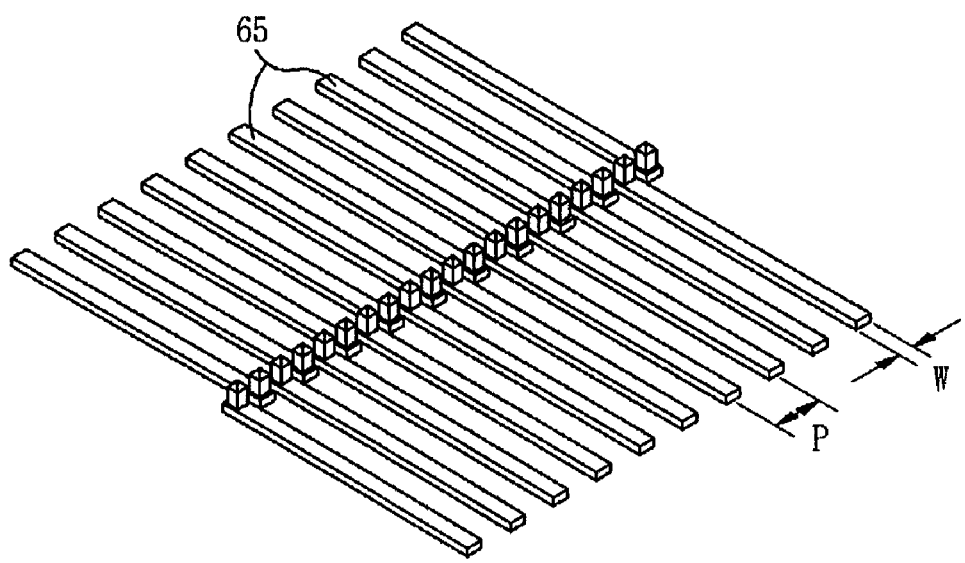
Figure 7B:
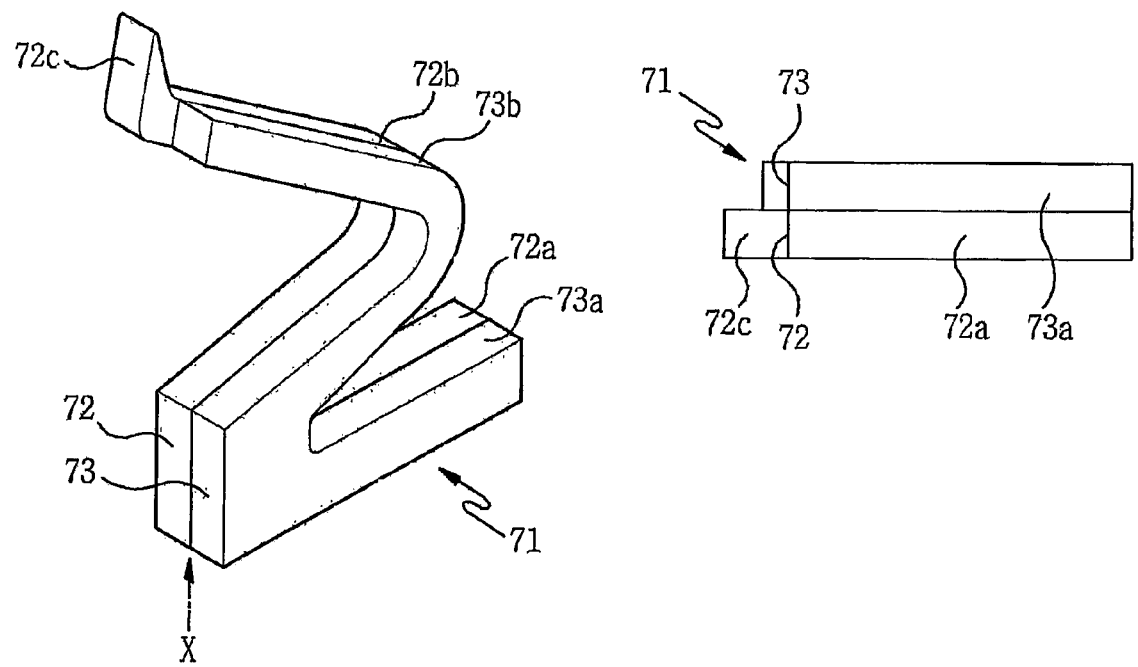
FIG. 7b is a perspective view and a bottom view respectively showing another preferred embodiment of the present invention.
Figure 11A:
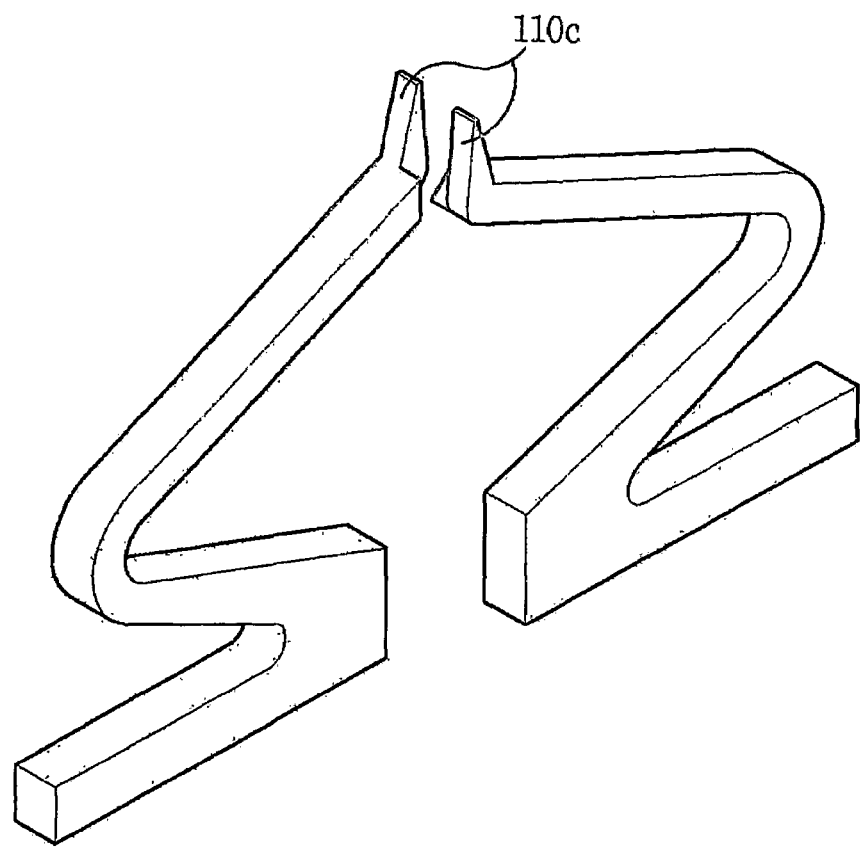
FIGS. 11a and 11b are a perspective view and a plan view respectively showing the disposition of the present invention.
Figure 11B:
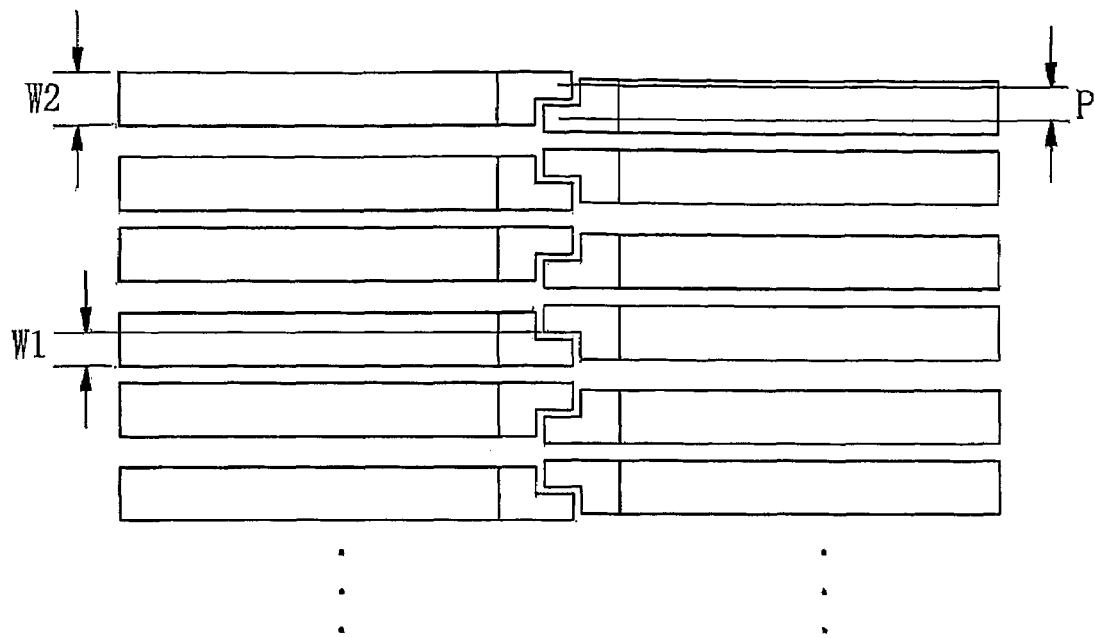

Referring to the left side of FIG. 7b, a probe 71 comprises a main probe 72, which is formed in the shape of a bent plate and made of metal, and an auxiliary probe 73, which is also formed in the shape of a bent plate and made of metal. The auxiliary probe 73 is similar to the main probe 72 except for the shape of one end thereof. The auxiliary probe 73 is attached to the main probe 72. The main probe 72 comprises: a body part 72b, which is bent at the middle thereof so that the body part 72b is elastically compressed and expanded when an external force is applied to the body part 72b; a connection part 72a integrally formed with one end of the body part 72b, the connection part 72a serving as a supporting beam for supporting the body part 72b when one end of the body part 72b is connected to a substrate; and a tip part 72c integrally formed with the other end of the body part 72b, the tip part 72c directly contacting a pad of an element to be tested. Similarly, the auxiliary probe 73 comprises: a body part 73b, which is bent at the middle thereof so that the body part 73b is elastically compressed and expanded when an external force is applied to the body part 73b; and a connection part 73a integrally formed with one end of the body part 73b, the connection part 73a serving as a supporting beam for supporting the body part 73b when one end of the body part 73b is connected to a substrate. The bottom of the probe 71, which is seen in the direction X at the left side of FIG. 7b, is shown at the right side of FIG. 7b. It can be seen from FIG. 7b that the tip part 72c is more extended to the left side than the connection parts 72a and 73a. The reason why the probe 71 is constructed as described above is that adjacent tip parts can be arranged densely in straight lines by an intersection arrangement of the probes. When the probes are arranged while intersecting each other as shown in FIG. 11a, the distance between tip parts 110c is decreased. FIG. 11b is a plan view simplifying the dense arrangement of the probes. It can be seen from FIG. 11b that the distance between the tip parts 10c, i.e., the pitch p, is smaller than that of the conventional cantilever-type probe (See FIGS. 6a and 6b). The width w1 of the tip part of the probe corresponds to half of the width w2 of the body part of the probe. Consequently, it is possible to manufacture a probe card having a pitch p smaller half than that of the conventional cantilever-type probe.

Figure 7C:
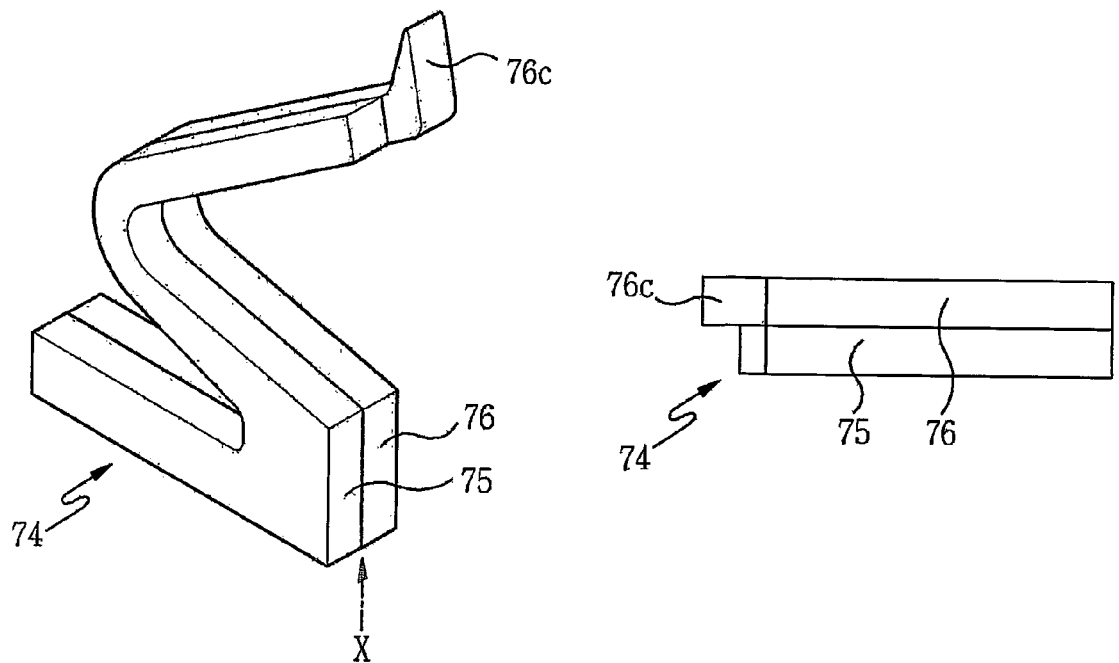
FIG. 7c is a perspective view and a bottom view respectively showing another preferred embodiment of the present invention.

A probe 74 shown in FIG. 7c is similar to the probe 71 shown in FIG. 7b except that an auxiliary probe 75 is disposed below a main probe 76. The auxiliary and main probes 76 and 75 are attached to each other. At one end of the main probe 76 is formed a tip part 76c. Consequently, the probe 74 of FIG. 7c is symmetrical to the probe 71 of FIG. 7b.

Figure 7D:
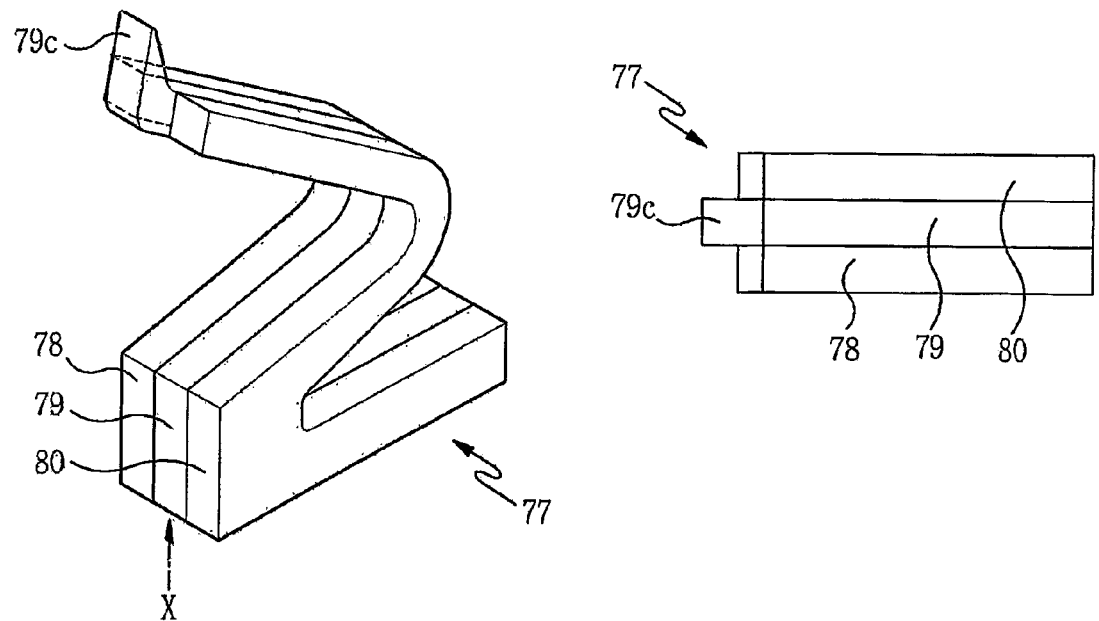
FIG. 7d is a perspective view and a bottom view respectively showing another preferred embodiment of the present invention.

A probe 77 shown in FIG. 7d is a combination of the probes of FIGS. 7b and 7c. Specifically, the probe 77 comprises: a main probe 79 having a tip part 79c formed at one end thereof; and auxiliary probes 78 and 80 attached to lower and upper sides of the main probe 79, respectively. The auxiliary probes 78 and 80 are provided for reinforcing the strength of the probe.

Figure 8:
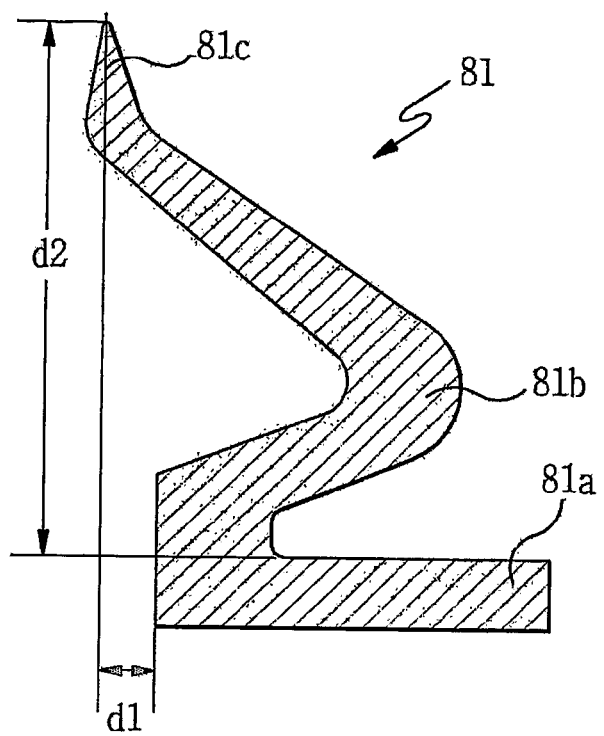
FIG. 8 is a cross-sectional view illustrating the shape of FIGS. 7a to 7d.

FIG. 8 is a cross-sectional view of the probe or the main probe shown in FIGS. 7a to 7d. Reference symbol d1 of FIG. 8 indicates the length by which a tip part 81c of a probe 81 is extended from the left end of a connection part 81a of the probe 81, and reference symbol d2 of FIG. 8 indicates the height from the connection part 81a to the end of the tip part 81c. With the provision of various probes having different values of d1 and d2, it is possible to manufacture a probe card provided with the various probes attached to a substrate, corresponding to the arrangement of complicated or dense pads, which will be describe later.

Figure 9:
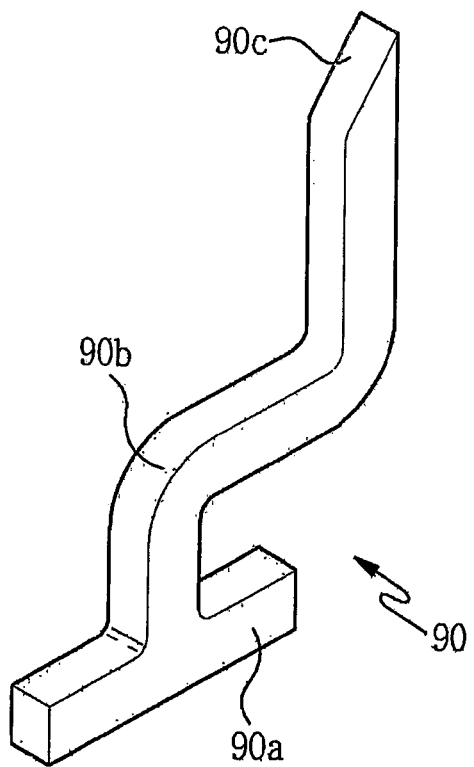
FIG. 9 is a perspective view showing still another preferred embodiment of the present invention.

A probe according to still another preferred embodiment of the present invention is shown in FIG. 9, in which the probe has a body part bent at a right angle. As shown in FIG. 9, the probe 90 comprises: a body part 90b, which is bent at a right angle so that the body part 90b is elastically compressed and expanded when an external force is applied to the body part 90b; a connection part 90a integrally formed with one end of the body part 90b, the connection part 90a serving as a supporting beam for supporting the body part 90b when one bent end of the body part 90b is connected to a substrate; and a tip part 90c integrally formed with the other bent end of the body part 90b, the tip part 90c directly contacting a pad of an element to be tested.

As in the above-mentioned preferred embodiments shown in FIGS. 7a to 7d, the probe 90 shown in FIG. 9 may be prepared as a main probe, and an auxiliary probe may be attached to one side of the probe 90. Alternatively, two auxiliary probes may be attached to both sides of the probe 90, respectively. The detailed description and the drawings thereof will not be given.

Figure 10:
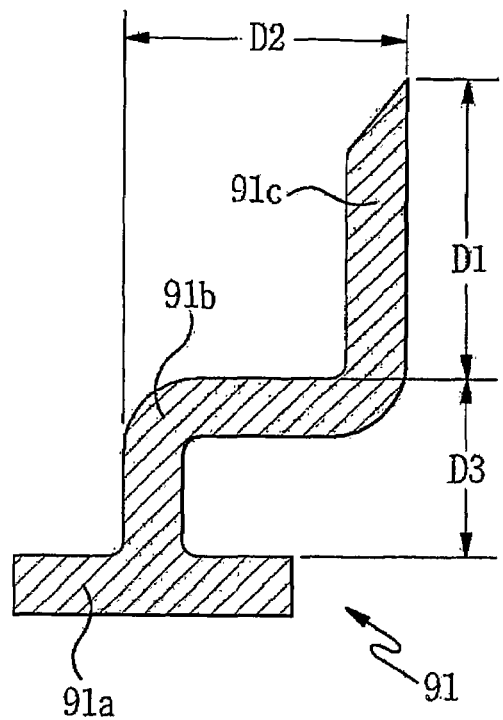
FIG. 10 is a cross-sectional view illustrating the shape of FIG. 9.

FIG. 10 is a cross-sectional view of the probe 90 shown in FIG. 9. Reference symbol D1 of FIG. 10 indicates the height from one end of a horizontal body part 91b of a probe 91 to the end of a tip part 91c, reference symbol D2 of FIG. 10 indicates the length of the horizontal body part 91b, and reference symbol D3 of FIG. 10 indicates the height from the other end of the horizontal body part 91b to a connection part 91a. The parts of the body part 91b corresponding to the reference symbols D1, D2, and D3 are referred to as a first vertical section, a horizontal section, and a second vertical section.

With the provision of various probes having different values of D1, D2, and D3, i.e., the first vertical section, the horizontal section, and the second vertical section of the body part 91b, as in the probe shown in FIG. 8, it is possible to manufacture a probe card provided with various probes attached to a substrate, corresponding to the arrangement of complicated or dense pads. When D2 is increased, it is required to increase the thickness of the probe since the elasticity is severely changed. The proportional relation between D2 and the thickness of the probe necessary to maintain the elasticity of the probe constantly may be applied to the design of the probe by showing the relation obtained from experiments in the form of a graph.

Figure 1:
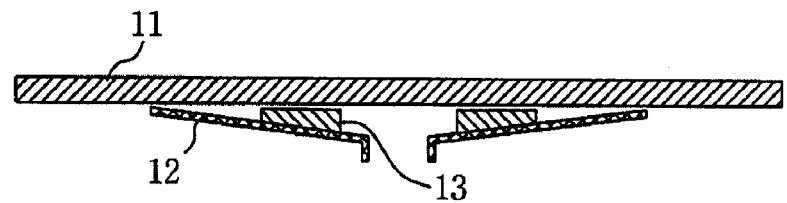
FIG. 1 is a cross-sectional view showing the fixation of a conventional probe.
Figure 2:
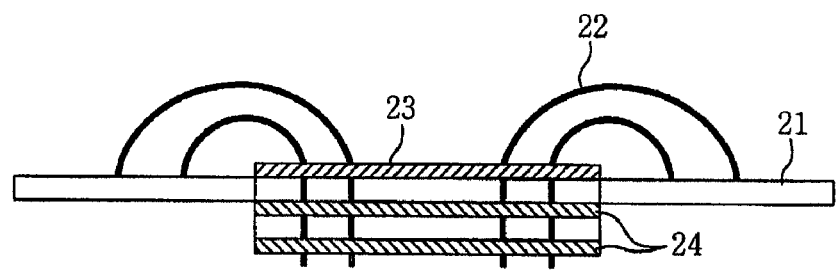
FIG. 2 is a cross-sectional view showing the fixation of another conventional probe.
Figure 3A:
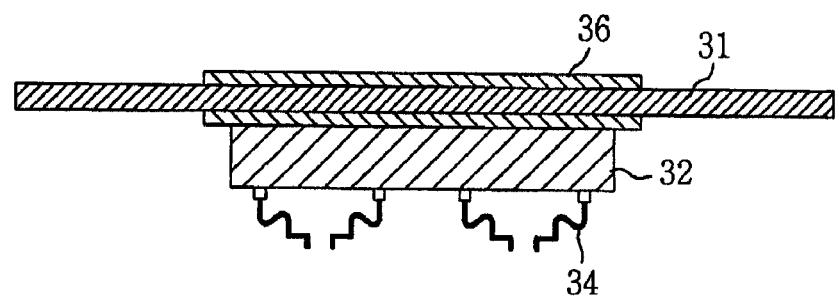
FIGS. 3a and 3b are a cross-sectional view showing the fixation of another conventional probe and a cross-sectional view showing the process of making the probe, respectively.
Figure 3B:
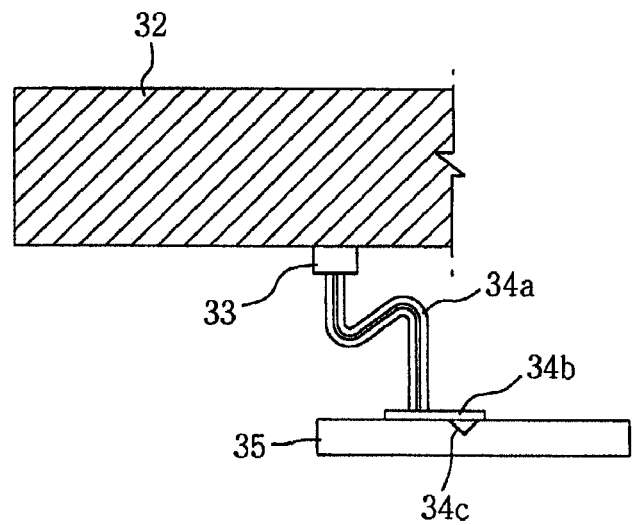
Figure 4A:
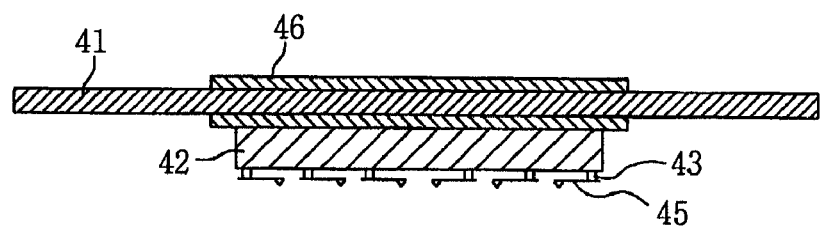
FIGS. 4a and 4b are a cross-sectional view showing the fixation of still another conventional probe and a cross-sectional view showing the process of making the probe, respectively.
Figure 4B:
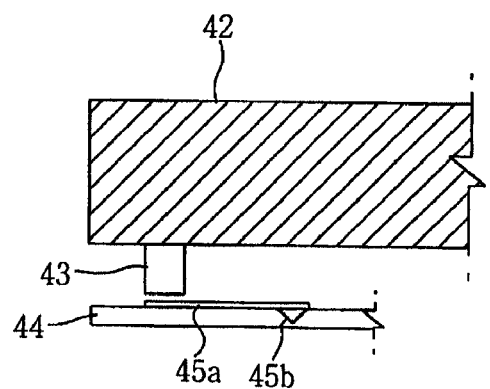
Figure 5A:
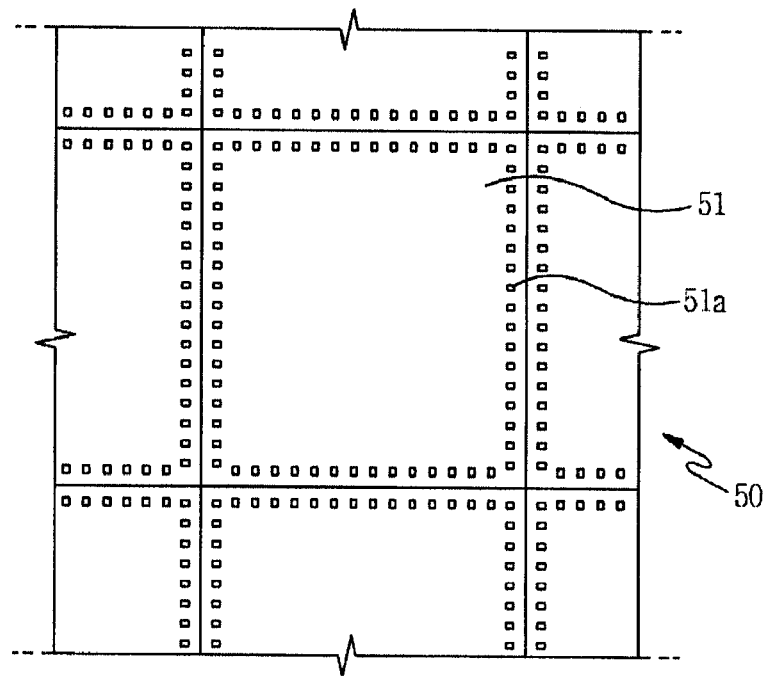
FIG. 5a is a plan view showing an example of an element, which is to be tested.
Figure 5B:
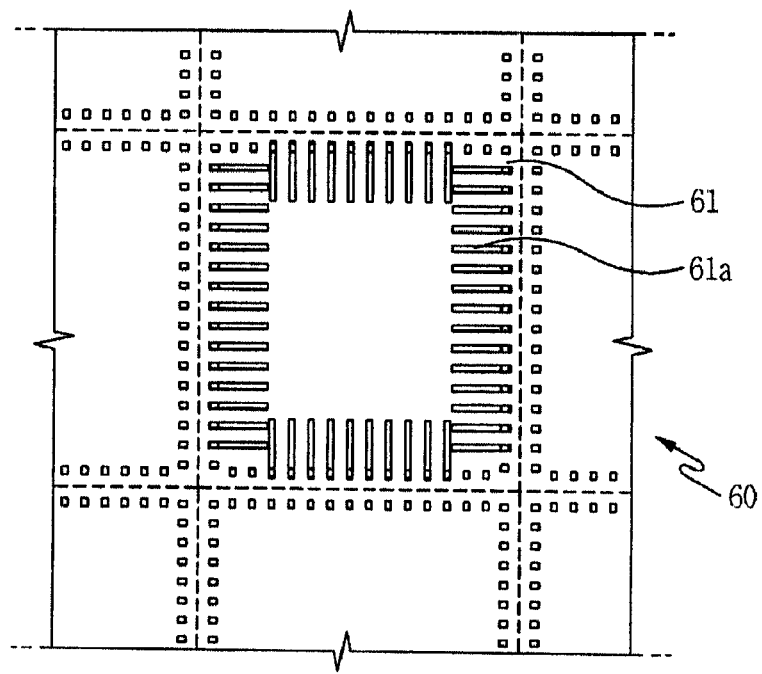
Figure 12A:
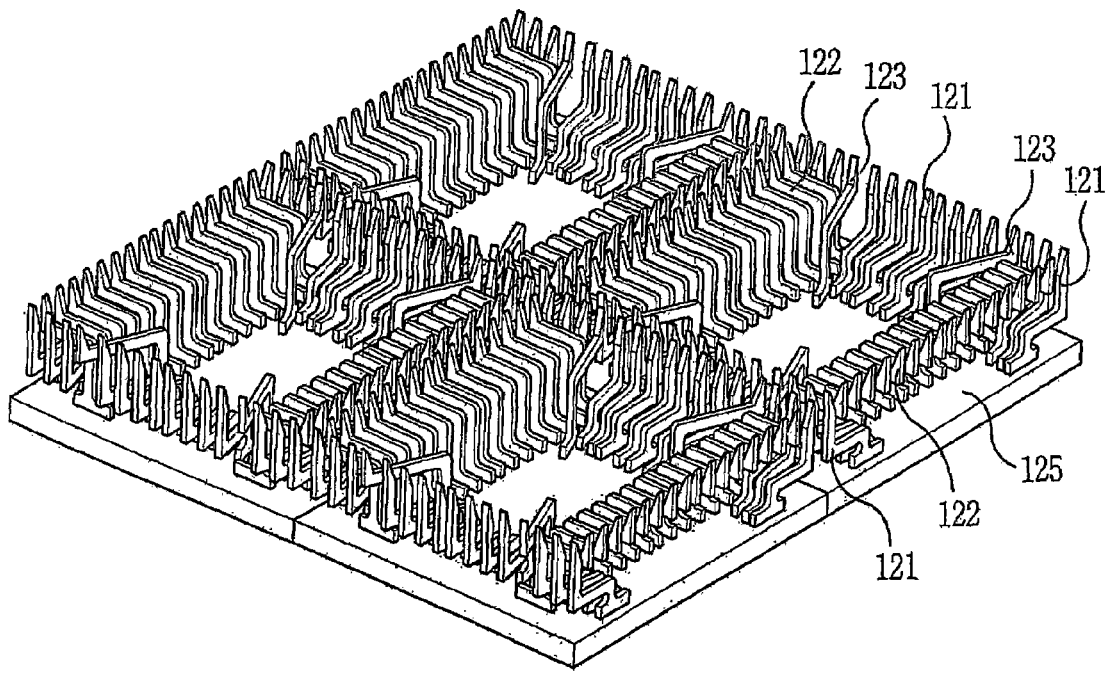
FIGS. 12a and 12b are a perspective view and a plan view respectively showing a probe card according to a preferred embodiment of the present invention.
Figure 12B:
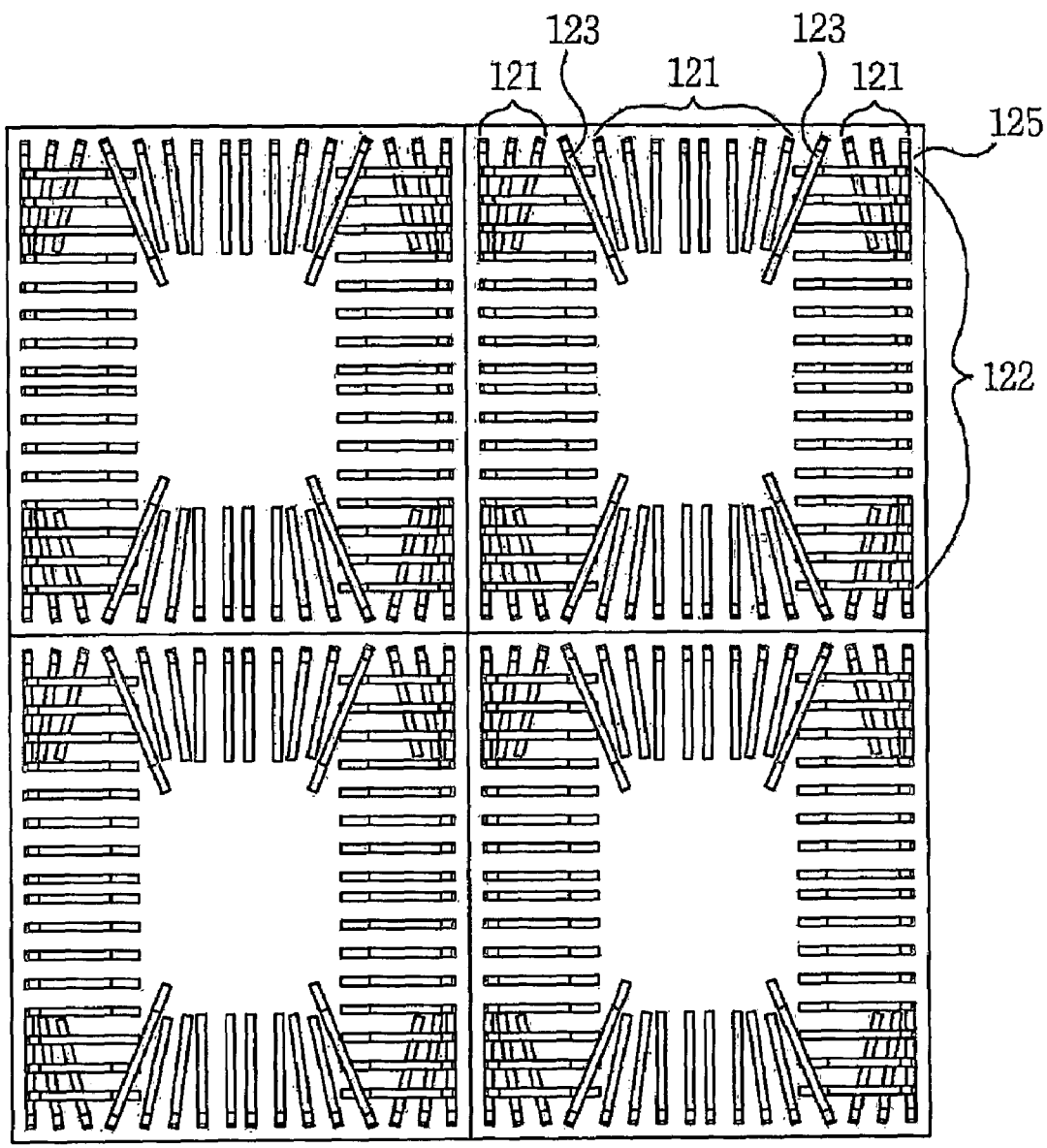
Figure 12C:
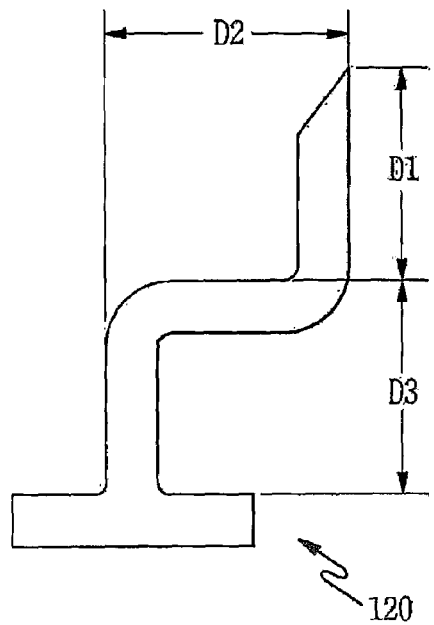
Figure 12C:
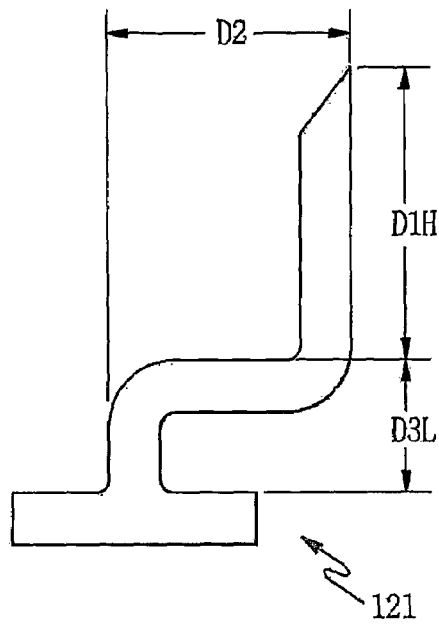
Figure 12C:
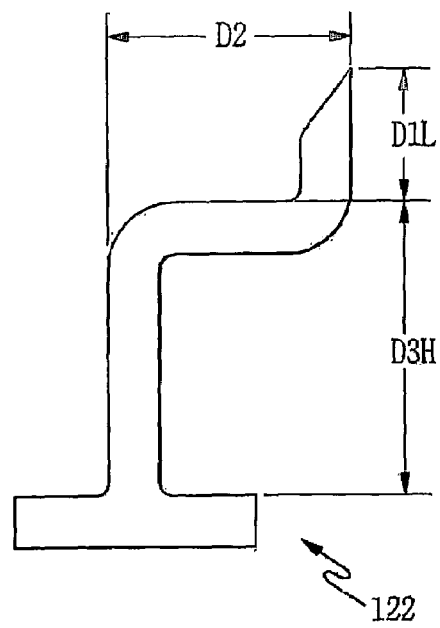
Figure 12C:
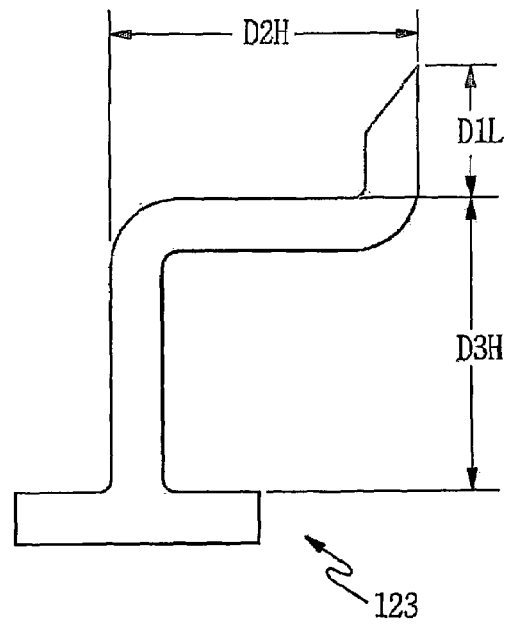

FIGS. 12a to 12c are views illustrating an application of the probe 90 shown in FIG. 90. FIG. 12a is a partial perspective view of a probe card, and FIG. 12b is a plan view of the probe card shown in FIG. 12a. The arrangement of the probes on the probe card is carried out to perform a test on the arrangement of pads on the wafer as shown in FIG. 5a, as mentioned in the background art. It can be seen from the above drawings that probes attached on each unit substrate 125 must be arranged in the area of the unit substrate 125. As shown in FIG. 12a, various probes having different values of D1, D2, and D3 as described with reference to FIG. 10, are attached on the unit substrate. Specifically, on the unit substrate are attached: first probes 121 each having D1H, which is larger than D1, and D3L, which is smaller than D3; second probes 122 each having D1L, which is smaller than D1, and D3H, which is larger than D3; and third probes 123 each having D1L, which is smaller than D1, and D2H and D3H, which are larger than D2 and D3, respectively. The first, second, and third probes have the same total heights as a standard probe 120 shown in FIG. 12c. The first, second, and third probes are attached on the unit substrate as follows: The second probes 122 are attached along one side of the unit substrate 125, and the first probes 121 are attached along the adjacent side of the unit substrate, as shown in FIG. 12a. At the corner between the adjacent sides of the unit substrate are attached the first probes 121. Since the height of the horizontal section of each of the first probes 121 is smaller than that of the horizontal section of each of the second probes 122, no interference is created between the probes. In the case that the space where the first probes 121 are attached at the corner of the unit substrate is insufficient, the third probes 123 are attached from the inside of the unit substrate 125 as shown in FIG. 12a. The attachment of the probes is shown in FIG. 12b, which is a plan view showing the attachment of the probes. The attachment of the probes is manually carried out by means of a laser beam.

A method of making a probe according to a preferred embodiment of the present invention will now be described with reference to FIGS. 13a to 13f, which are cross-sectional views of a substrate showing main steps of making the probe. The probe making method of the present invention is provided for manufacturing the probe shown in FIG. 7b.

Figure 13A:
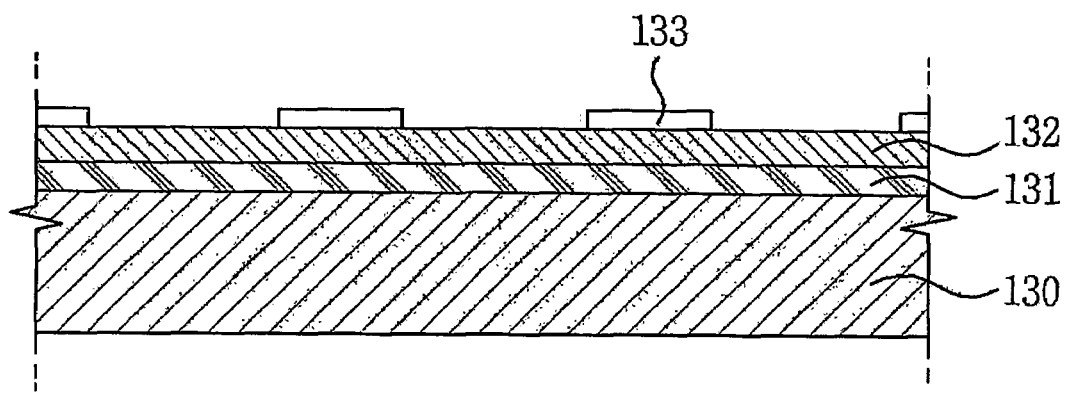
FIGS. 13a to 13g are cross-sectional views illustrating a method of making a probe according to the present invention.
Figure 13B:
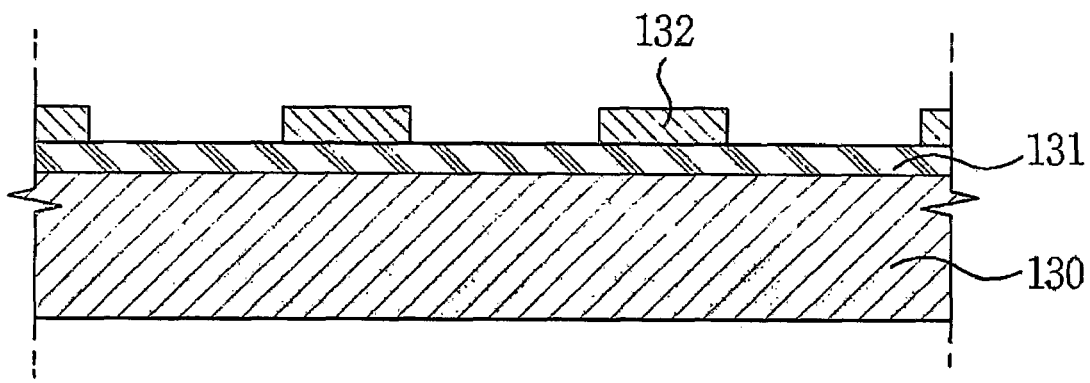
Figure 13C:
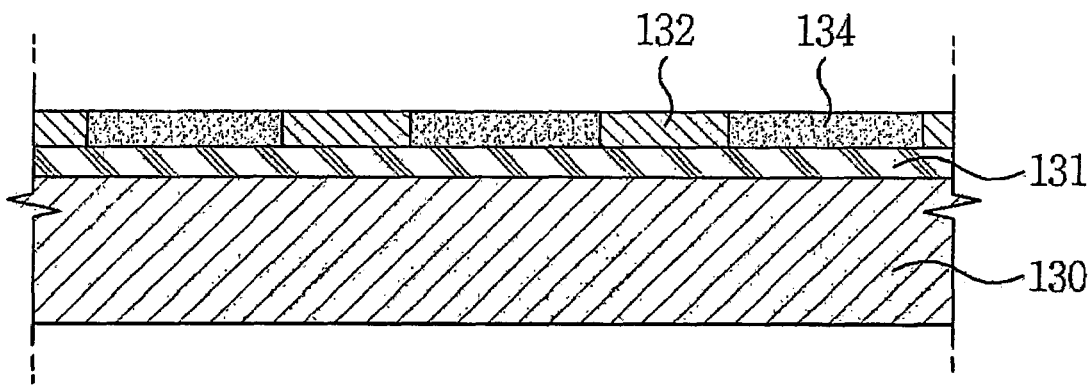
Figure 14A:
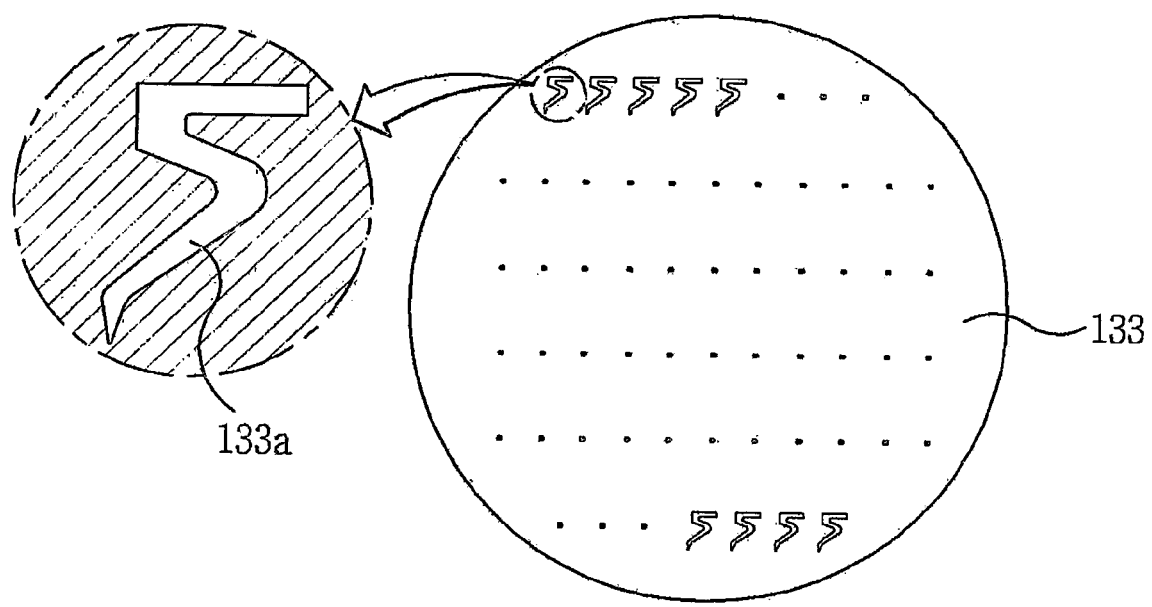
FIGS. 14a and 14b are views respectively illustrating the shape of a mask used in the method of making the probe according to the present invention.

To the whole upper surface of a silicon wafer 130 is applied a copper layer 131, which is a sacrifice layer, as shown in FIG. 13a. The copper layer 131 is coated at the upper surface thereof with a photoresist 132. On the upper surface of the photoresist 132 is attached a first mask 133 having a shape pattern of a desired probe. The first mask 133 has the shape as shown in FIG. 14a. As can be seen from the enlarged part of FIG. 14a, the shape of the space part 133a of the mask corresponds to that of the main probe 72 shown in FIG. 7b. The photoresist 132 is exposed and developed by means of the first mask 133. Subsequently, the first mask 133 is removed as shown in FIG. 13b. Electrolytic plating is performed on the upper surface of the copper layer 131 having the pattern fixed by means of the exposure and development. The plated upper surface of the copper layer is ground to form a first metallic film 134 having the shape of the main probe 72 (FIG. 7b) as shown in FIG. 13c.

Figure 13D:
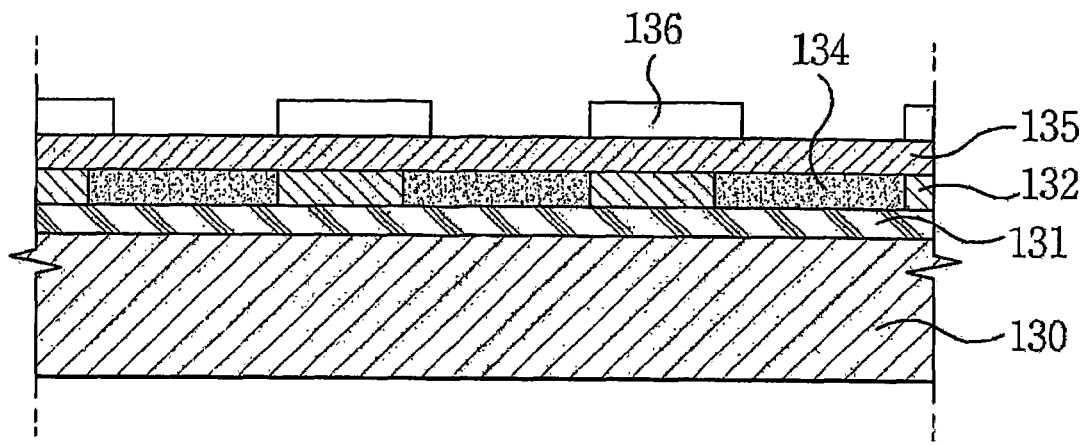
Figure 13E:
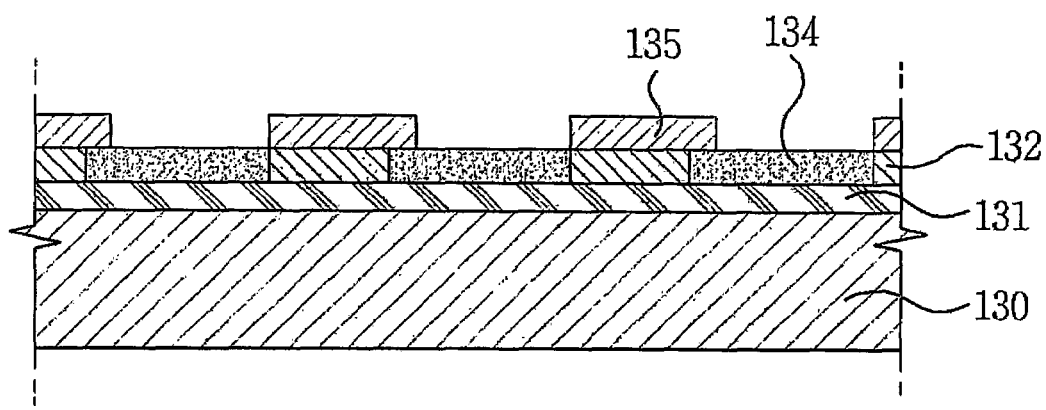

As shown in FIG. 13d, the photoresist 132 and the first metallic film 134 are coated at the upper surfaces thereof with a photoresist 135. On the upper surface of the photoresist 135 is attached a second mask 136 having a shape pattern of a desired probe. The second mask 136 has the shape as shown in FIG. 14b. As can be seen from the enlarged part of FIG. 14b, the shape of the space part 136a of the mask corresponds to that of the auxiliary probe 73 shown in FIG. 7b. The photoresist 135 is exposed and developed by means of the second mask 136 of FIG. 13d. Subsequently, the second mask 136 is removed as shown in FIG. 13e. Electrolytic plating is performed on the upper surface of the first metallic film 134 having the pattern fixed by means of the exposure and development. The plated upper surface of the first metallic film is ground to form a second metallic film 137 having the shape of the auxiliary probe 73 (FIG. 7b) as shown in FIG. 13f.

Figure 13F:
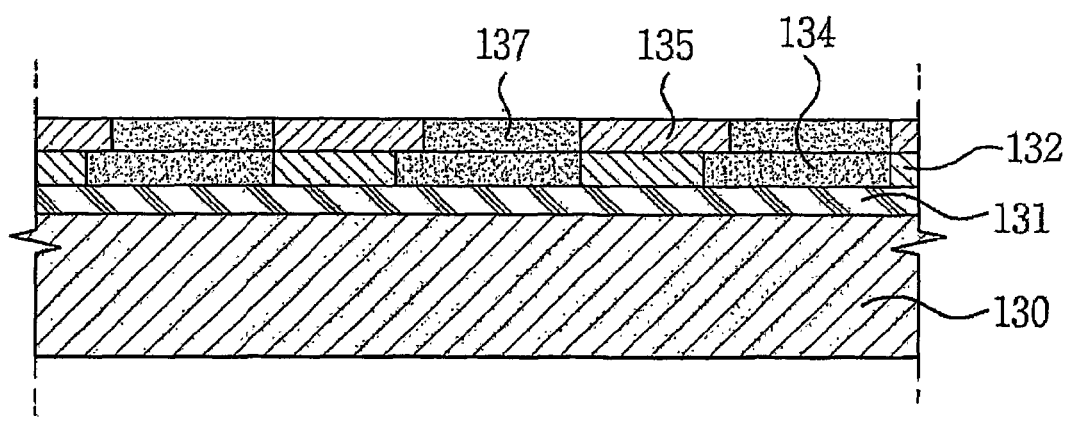
Figure 13G:
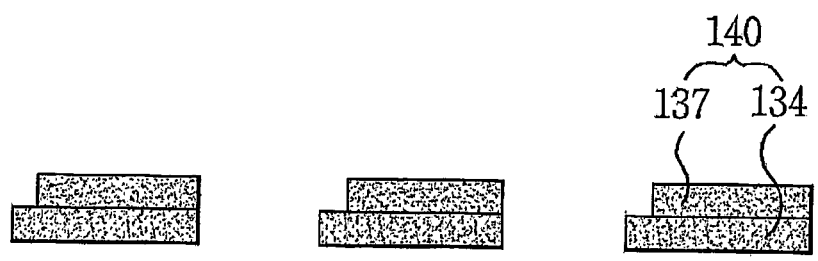
Figure 14B:
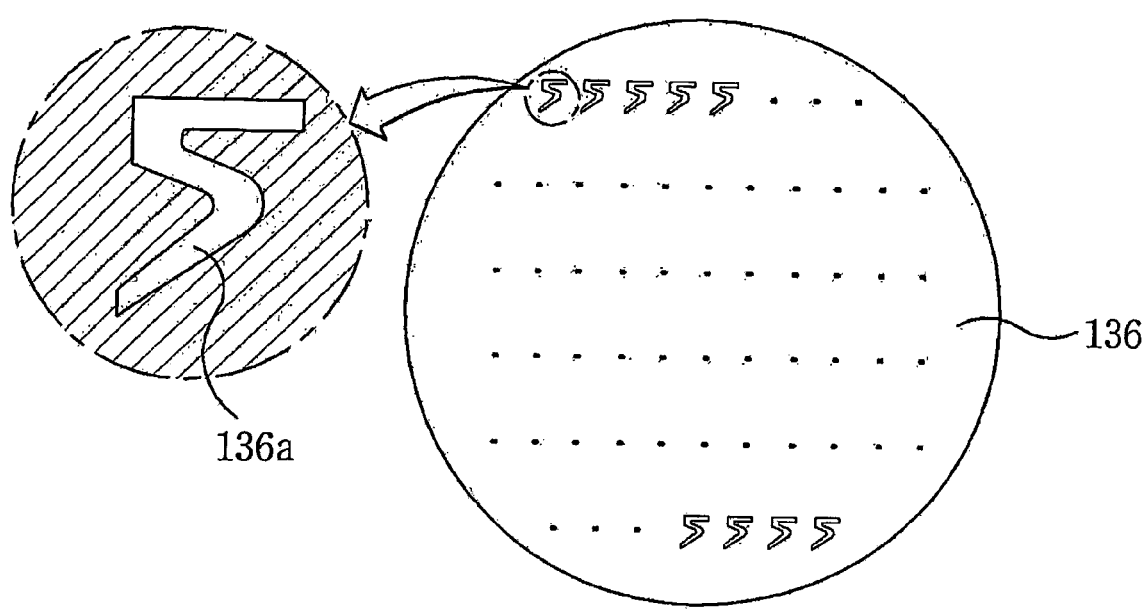

Finally, the photoresists 132 and 135 of FIG. 13f are removed, and then the copper layer 131 of FIG. 13f is etched by means of a wet etching method so that the first metallic film 134 and the second metallic film 137 are separated from the silicon wafer 130. Consequently, a probe 140 as shown in FIG. 13s is manufactured.

The probes according to other preferred embodiments of the present invention may be manufactured by means of the above-described probe making method. The probe 70 of FIG. 7a may be obtained by forming only the first metallic film 134 (FIG. 13c). The probe 74 of FIG. 7c may be obtained by carrying out the steps related to the second mask 136 (FIG. 13d) and then carrying out the steps related to the first mask 133 (FIG. 13a). The probe 77 of FIG. 7d may be obtained by further carrying out the steps related to the second mask 136 (FIG. 13d) before the manufacturing process of the probe 74 of FIG. 7c is finished to further form another second metallic film 137 (FIG. 13f).

Also, the probe 90 of FIG. 9 and other probes (not shown) similar to the probes shown in FIGS. 7b to 7d may be manufactured by means of the same steps as mentioned above. In this case, however, it is required that the space part of the mask be deformed according to the shape of the probe.

INDUSTRIAL APPLICABILITY

As apparent from the above description, the present invention provides a probe having a minute pitch, with which a probe card corresponding to arrangement of pads formed with a dense shape or other various shapes on a wafer is made.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A probe having a prescribed thickness and formed in the shape of a flat plate, the probe comprising:
   a main probe including:
      a body part bent at the middle thereof so that the body part is elastically tensioned or compressed when a tension force or a compression force is applied to the body part at the upper and lower ends thereof;
a connection part integrally formed with the lower end of the body part, the connection part being fixed to a substrate; and
a tip part integrally formed with the upper end of the body part, the tip part contacting a pad of an element; and
an auxiliary probe being fixedly attached to one side of the main probe, the auxiliary probe including:
a body part identical to the body part of the main probe, the body part being attached to one side of the body part of the main probe so that the body part is elastically tensioned or compressed when a tension force or a compression force is applied to the body part at the upper and lower ends thereof, thereby reinforcing the strength of the probe; and
a connection part identical to the connection part of the main probe, wherein the auxiliary probe is not provided with a tip part.

2. The probe as set forth in claim 1, wherein the body part comprises:
a horizontal section;
a first vertical section bent vertically downward from one end of the horizontal section, the first vertical section being integrally connected to the connection part; and
a second vertical section bent vertically upward from the other end of the horizontal section, the second vertical section being integrally connected to the tip part.

3. The probe as set forth in claim 2, wherein the lengths of the horizontal section, the first vertical section, and the second vertical section of the body part are different from one another to form more than two kinds of probes.

4. The probe as set forth in claim 1 or 2, wherein the tip part is formed such that the end of the tip part, contacting the pad of the element, is disposed at the outermost side of the main probe in the horizontal direction.

5. The probe as set forth in claim 1, further comprising another auxiliary probe is further fixedly attached to the other side of the main probe.

6. A probe card including a main probe and an auxiliary probe, each of the probes having a prescribed thickness and formed in the shape of a flat plate,
wherein the main probe comprises: a body part bent at the middle thereof so that the body part is elastically tensioned or compressed when a tension force or a compression force is applied to the body part at the upper and lower ends thereof a connection part integrally formed with the lower end of the body part, the connection part being fixed to a substrate; and a tip part integrally formed with the upper end of the body part, the tip part contacting a pad of an element; and
an auxiliary probe being fixedly attached to one side of the main probe, the auxiliary probe including: a body part identical to the body part of the main probe, the body part being attached to one side of the body part of the main probe so that the body part is elastically tensioned or compressed when a tension force or a compression force is applied to the body part at the upper and lower ends thereof, thereby reinforcing the strength of the probe; and a connection part identical to the connection part of the main probe, wherein the auxiliary probe is not provided with a tip part,
wherein the body part comprises:
a horizontal section; and
a first vertical section bent vertically upward from one end of the horizontal section, the first vertical section being integrally connected to the tip part;
a second vertical section bent vertically downward from the other end of the horizontal section, the second vertical section being integrally connected to the connection part,
wherein the lengths of the horizontal section, the first vertical section, and the second vertical section of the body part are different from one another to form more than two kinds of probes, and
wherein the more than two kinds of probes are fixedly attached on the substrate of the probe card.

* * * * *